PRINTED CIRCUIT ARTICLE

Filed Dec. 31, 1957

Victor F. Dahlgren
Thomas H. Stearns
INVENTORS

United States Patent Office 2,994,059

Patented July 25, 1961

2,994,059

PRINTED CIRCUIT ARTICLE

Victor F. Dahlgren, West Windham, and Thomas H. Stearns, Plainfield, N.H., assignors to Sanders Associates, Inc., Nashua, N.H., a corporation of Delaware Filed Dec. 31, 1957, Ser. No. 706,477

7 Claims. (Cl. 339—188)

The present invention relates to printed circuit type articles, such as flexible cabling utilizing copper conductors bonded to a wide range of plastic materials. More particularly, this invention relates to printed circuit cables having an exposed terminal so formed as to facilitate coupling to an electrical apparatus.

Printed circuit articles have been developed providing the equivalent of the conventional multi-conductor cables. The printed circuit type of cable is formed of a flat, relatively thin sheet of plastic material having flat, thin conductors all in the same plane or at most in a few superimposed planes. In one form of such a cable, the conductors are of uniform width and separated by a uniform distance. The conductors are typically embedded in the plastic material.

The present invention is directed to an improvement in such printed circuits by providing a solution for the problems arising from wiring and soldering connections to a wide range of electrical apparatus. In the past, the wiring of electrical systems having a number of connections, such as, for example bayonet connectors, required the wire to be stripped, soldered to contact buttons, crimped and threaded through the socket. Many of these wiring problems have been simplified to some extent by the use of printed circuit techniques which provide pre-connected assemblies. Such printed circuits generally take the form of relatively rigid dielectric boards having conductors bonded to one or more surfaces thereof. While such an arrangement is ideally suited to certain electrical and electronic applications, it cannot be used to replace conventional wiring where length and flexibility are essential.

Another example of a problem not yet solved by conventional printed circuitry is the lack of a flexible, high dielectric strength printed circuit that may be substituted for high voltage leads. The need here is for flexible encapsulated conductors designed with a termination for limiting corona effect.

It is, therefore, an object of the present invention to provide an improved printed circuit article adapted for solderless connection to a wide range of electrical devices.

It is a further object of the present invention to provide a printed circuit cable having terminals adapted for solderless connection to electrical connectors.

An additional object of this invention is to provide an improved flexible, printed circuit cable for high voltage applications.

Yet another object of this invention is to provide an improved flexible, printed circuit cable having terminals adapted to reduce corona effect.

In accordance with the present invention, there is provided a printed circuit article comprising a flat, flexible, plastic, printed circuit cable having a conductor embedded therein. This conductor has an exposed terminal and means integral with this terminal for engaging the terminal with a receptacle for coupling the printed circuit cable to an electrical device.

As used herein, the term "plastic" includes a synthetic organic material of high molecular weight, and which, while solid in the finished state, at some stage in its manufacture is soft enough to be formed into shape by some degree of flow. The well-known term "Kel–F" as used herein is trademark of The M. W. Kellogg Company and refers to the plastic polymer tri-fluoro-chloro-ethylene as manufactured by them. The well-known term "Teflon" as used herein is the trademark of the E. I. du Pont de Nemours & Company, Inc. and refers to the plastic polymer tetra-fluoro-ethylene manufactured by them. The term "ethylene" includes all those plastic materials containing an ethylene radical and the term "vinyl" includes all those plastic materials containing a vinyl radical. The term "Saran," trademark of the Dow Chemical Company, is used herein to denote those plastic materials containing a vinylidine radical. The term "nylon" as used herein refers generically to the group of plastic materials known as polyamides.

For a better understanding of the present invention, together with other and further objects thereof, reference is made to the following description taken in connection with the accompanying drawings and its scope will be pointed out in the appended claims.

Figure 1:
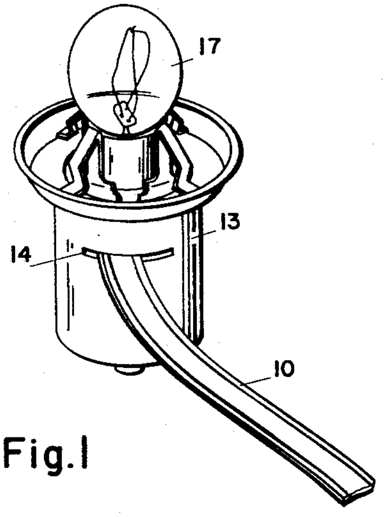
FIG. 1 is a perspective view of a printed circuit cable embodying the invention and shown connected to a lamp socket.
Figure 2:
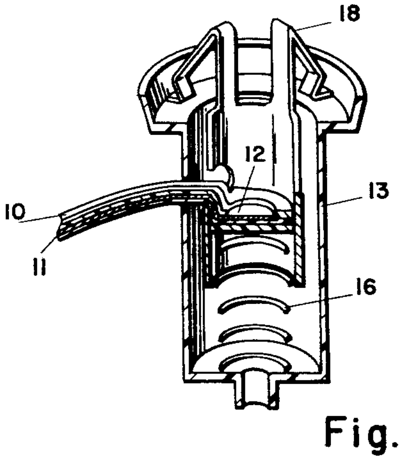
FIG. 2 is a perspective view, in section, of the cable and socket of FIG. 1.
Figure 3:
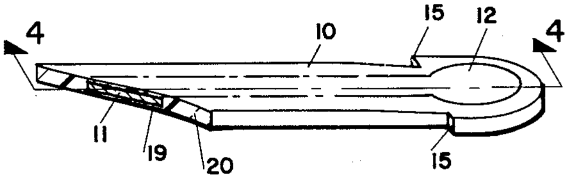
FIG. 3 is a perspective view, partly in section, of the cable and terminal in FIG. 1.

Referring now to FIGS. 1–4 of the drawings, there is here shown a flat, flexible printed circuit cable 10 having a conductor 11 and a terminal 12. This terminal 12 is designed for insertion into a receptacle 13 which, for convenience, is illustrated as a bayonet type lamp socket. The side of receptacle 13 is provided with a slot 14 through which the terminal 12 of cable 10 may be inserted. As illustrated specifically in FIG. 3, the terminal 12 is flared to form an arrowhead shape, the base of which is slightly wider than the slot 14. The salient feature of this design is that the flared edges 15 prevent undesired withdrawal of the terminal 12 from the receptacle 13. Removal of the terminal 12 may then best be accomplished by pulling it up through the top of the receptacle 13 and drawing the entire length of cable 10 through the slot 14 and the receptacle 13. Associated with the receptacle 13 is a means, such as a spring 16, for urging the terminal 12 into electrical contact with the terminal on the base of the lamp 17. The receptacle is also equipped with prongs 18 adapted to grip an aperture in a panel. This terminal-receptacle design has the outstanding advantages of being completely solderless, reliable and economical to produce.

Figure 4:
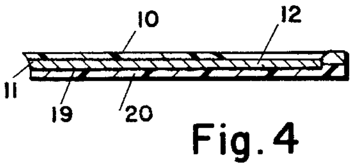
FIG. 4 is a sectional view of the cable taken along the line 4—4 of FIG. 3.

While applicant does not intend to be limited to any particular materials in the manufacture of the article of this invention, the combination of copper and poly-tri-fluoro-chloro-ethylene has been found to be particularly useful. For example, the printed circuit cable may be made from 1 ounce (1.37 mil) copper conductors having an adherent coating of black cupric oxide formed by oxidation in a chemical bath; these conductors are then readily laminated between 2 to 5 mil sheets of poly-tri-fluoro-chloro-ethylene. FIG. 4 particularly illustrates the laminate structure showing in cross section the copper conductor 11, the cupric oxide coating 19 and the poly-tri-fluoro-chloro-ethylene insulation 20. The receptacle 13 may be conveniently made from other molded plastic or metal. Other plastic materials that have been successfully employed include polyethylene, Teflon, polyvinyl acetate and polyvinyl chloride, however, it is believed that this principle applies broadly to all plastics and applicants do not intend to be limited to those cited.

Figure 5:
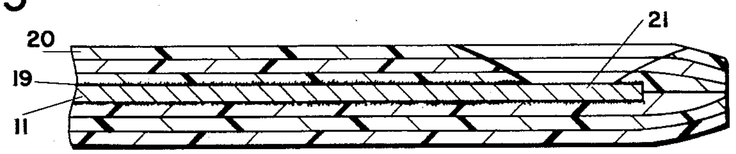
FIG. 5 is a side elevational view, in section, of a high voltage printed circuit cable and terminal.
Figure 6:
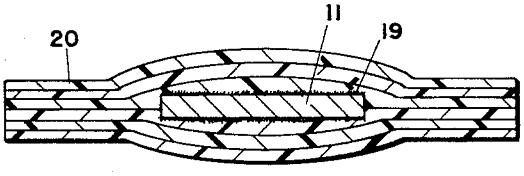
FIG. 6 is a front elevational view, in section, of the high voltage cable of FIG. 5.

Referring now to FIGS. 5 and 6 of the drawings, there is shown another useful embodiment of the present invention. Illustrated here is a high voltage printed circuit cable showing a conductor, for example a copper conductor 11, having an adherent coating of black cupric oxide 19 formed by oxidation in a chemical bath. The conductor 11 is encapsulated in a number of laminations of a plastic insulating material 20. This laminated structure has the advantage, in a high voltage application, of providing greater dielectric strength for a given thickness than a single layer of insulation. Also illustrated in FIG. 5 is a unique terminal design 21 showing an exposed conductor area depressed in a matrix of insulating material. Such a design has the distinct advantage of providing a raised, encircling periphery of insulation about any terminal connection. This will, of course, minimize the problem associated with corona effect that generally tend to plague high voltage apparatus.

A means of manufacturing such a terminal would be to remove the plastic above the conductor with a rotary boring or abrasive tool. Either of these could quickly remove the plastic and cupric oxide, leaving a frusto-conical cavity exposing the conductor as shown.

The cable end surrounding the high voltage terminal 21 may assume any variety of shapes, including the arrowhead shape of terminal 12 in the previous embodiment. For example, an arrowhead shaped terminal on a high voltage printed circuit cable could be used to engage an appropriately slotted receptacle at the anode connection of a cathode ray tube. This usage is readily adapted to the manufacture of television receivers where a printed circuit cable of the type described may be used between the high voltage rectifier and the anode of the picture tube.

There are many other analogous uses for a printed circuit cable having a flat form factor and solderless terminal which would be obvious to those skilled in the art.

While there has been described what are at present considered to be the preferred embodiments of this invention, it will be obvious to those skilled in the art that various changes and modifications may be made therein without departing from the invention, and it is, therefore, aimed in the appended claims to cover all such changes and modifications as fall within the true spirit and scope of the invention.

What is claimed is:

1. A high voltage printed circuit article, comprising: a flat, flexible, plastic, printed circuit cable having a conductor; a plurality of plastic insulating layers on either side of said conductor and laminated to one another encapsulating said conductor; a terminal on said conductor at said cable end, the exposed area of said terminal being depressed in a matrix of insulating material to limit corona effects at said terminal, said cable end flaring about said terminal; and a receptacle for coupling said cable to a high voltage apparatus, said receptacle having a slot therein narrower than said flared cable end to receive said flared cable end and prevent undesired withdrawal of the cable therefrom.

2. A high voltage printed circuit article, comprising: a flat, flexible, plastic, printed circuit cable having a copper conductor; a plurality of plastic insulating layers on either side of said conductor and laminated to one another encapsulating said conductor; a terminal on said conductor at said cable end, the exposed area of said terminal being depressed in a matrix of insulating material to limit corona effects at said terminal, said cable end flaring about said terminal; and a receptacle for coupling said cable to a high voltage apparatus, said receptacle having a slot therein narrower than said flared cable end to receive said flared cable end and prevent undesired withdrawal of the cable therefrom.

3. A high voltage printed circuit article, comprising: a flat, flexible, plastic, printed circuit cable having a copper conductor coated with black cupric oxide produced by oxidation in a chemical bath; a plurality of plastic insulating layers on either side of said conductor and laminated to one another encapsulating said conductor; a terminal on said conductor at said cable end, the exposed area of said terminal being depressed in a matrix of insulating material to limit corona effects at said terminal said cable end flaring about said terminal; and a receptacle for coupling said cable to a high voltage apparatus, said receptacle having a slot therein narrower than said flared cable end to receive said flared cable end and prevent undesired withdrawal of the cable therefrom.

4. An electrical connector cable and receptacle comprising: a flat, flexible insulated cable having a conductor embedded therein, said conductor having an exposed portion near the end thereof, and said cable having insulation with a resilient enlargement thereon; an electrical receptacle for an electrical apparatus inserted along an axis of electrical contact, said receptacle having a slot therein substantially perpendicular to said axis, said slot being narrower than said resilient enlargement to engage said resilient enlargement for preventing undesirable withdrawal from said slot and said receptacle having a resilient means therein for effecting electrical contact between said conductor exposed portion and said electrical apparatus.

5. An electrical connector cable and receptacle, comprising: a flat, flexible insulated cable having a conductor embedded therein, said conductor having an exposed portion near the end thereof, and said cable having insulation with a resilient enlargement thereon; an electrical bayonet type receptacle for an electrical apparatus inserted along an axis of electrical contact, said receptacle having a slot therein substantially perpendicular to said axis, said slot being narrower than said resilient enlargement for preventing undesirable withdrawal from said slot and said receptacle having a resilient means therein for effecting electrical contact between said conductor exposed portion and said electrical apparatus.

6. A high voltage printed circuit article comprising a flat, flexible, plastic printed circuit cable having a conductor; a plurality of plastic insulating layers on each side of said conductor and laminated to one another encapsulating said conductor; and a terminal on said conductor so disposed that the edges of said terminal are covered by portions of said insulating layers; said terminal having an area inwardly of said edges exposed through an opening in said insulating layers.

7. A high voltage printed circuit article comprising a flat, flexible, plastic, printed circuit cable having a conductor; a plurality of plastic insulating layers on each side of said conductor and laminated to one another encapsulating said conductor; a terminal on said conductor so disposed that the edges of said terminal are covered by portions of said insulating layers, an exposed area of said terminal being depressed in a matrix of insulating material to limit corona effects at said terminal; a receptacle for receiving said terminal for coupling said printed circuit cable to other electrical apparatus; and means integral with said cable for positioning said terminal within said receptacle and to prevent undesired withdrawal of the terminal therefrom.

References Cited in the file of this patent

UNITED STATES PATENTS

| | | |
|---|---|---|
| 1,791,666 | Finn | Feb. 10, 1931 |
| 2,227,123 | Christen | Dec. 31, 1940 |
| 2,229,861 | McNabb | Jan. 28, 1941 |
| 2,296,151 | Dover | Sept. 15, 1942 |
| 2,502,291 | Taylor | Mar. 28, 1950 |
| 2,600,485 | Cox | June 17, 1952 |
| 2,668,281 | Clayton et al. | Feb. 2, 1954 |
| 2,745,898 | Hurd | May 15, 1956 |
| 2,767,383 | Killian et al. | Oct. 16, 1956 |
| 2,833,996 | Whicker et al. | May 6, 1958 |